United States Patent
Hirata

(10) Patent No.: US 8,164,946 B2
(45) Date of Patent: Apr. 24, 2012

(54) MAGNETIC MEMORY ELEMENT, MAGNETIC MEMORY DEVICE, INFORMATION RECORDING/REPRODUCING APPARATUS

(75) Inventor: Kei Hirata, Tokyo (JP)

(73) Assignee: TDK Corporation, Tokyo (JP)

( * ) Notice: Subject to any disclaimer, the term of this patent is extended or adjusted under 35 U.S.C. 154(b) by 107 days.

(21) Appl. No.: 12/839,947

(22) Filed: Jul. 20, 2010

(65) Prior Publication Data

US 2012/0020147 A1    Jan. 26, 2012

(51) Int. Cl.
*G11C 11/00* (2006.01)

(52) U.S. Cl. ............... 365/158; 365/148; 977/933

(58) Field of Classification Search ........... 365/48, 365/55, 62, 66, 74, 78, 80–93, 100, 130, 365/131, 148, 158, 171–173, 209, 213, 225.5, 365/230.07, 232, 243.5; 216/22; 257/295, 257/421, E21.665; 438/3; 428/810–816, 428/817–825.1, 826; 977/933–935
See application file for complete search history.

(56) References Cited

U.S. PATENT DOCUMENTS 6,574,130 B2 *   6/2003   Segal et al. .................. 365/129
6,643,165 B2 *  11/2003   Segal et al. .................. 365/151
2003/0042562 A1 *   3/2003   Giebeler et al. ............. 257/421
2003/0089899 A1 *   5/2003   Lieber et al. ..................... 257/9
2006/0006334 A1     1/2006   Kadono et al.

FOREIGN PATENT DOCUMENTS

| JP | 2003-60211   | 2/2003  |
| JP | 2004-146821  | 5/2004  |
| JP | 2007-235119  | 9/2007  |
| JP | 2007-2770611 | 10/2007 |
| JP | 2008-117893  | 5/2008  |

* cited by examiner

*Primary Examiner* — Richard Elms
*Assistant Examiner* — Harry W Byrne
(74) *Attorney, Agent, or Firm* — Oblon, Spivak, McClelland, Maier & Neustadt, L.L.P.

(57) ABSTRACT

A magnetic memory element includes a pair of electrodes, a junction layer, at least one carbon nanotube, and at least one nanowire. The at least one nanowire is made of a ferromagnetic material and extends through a hole of each the at least one carbon nanotube with both ends being electrically connected to the pair of electrodes, respectively. The junction layer is made of a non-magnetic material and disposed between one of the pair of electrodes and one end of each the at least one nanowire. The one of the pair of electrodes is made of a ferromagnetic material. Magnetization of the at least one nanowire is reversed by spin injection performed through the junction layer with the one of the pair of electrodes. When a DC bias current and a detection current having a frequency coinciding with a magnetic resonance frequency of the nanowire are applied in a superimposed manner, between the electrodes, within a range not reaching a critical current density of the magnetization reversal, the pair of electrodes have a voltage corresponding to a magnetization direction of the nanowire.

7 Claims, 11 Drawing Sheets

MAGNETIC MEMORY ELEMENT, MAGNETIC MEMORY DEVICE, INFORMATION RECORDING/REPRODUCING APPARATUS

BACKGROUND OF THE INVENTION

1. Field of the Invention

The present invention relates to a magnetic memory element, and a magnetic memory device and an information recording/reproducing apparatus using the same.

2. Description of the Related Art

The practical use of magnetic memories (MRAMs) has been studied and developed for many years. Among the magnetic memories, these days, a STT (Spin Transfer Torque) type has been vigorously studied and developed because of its advantages with respect to high speed and high integration. In order to obtain an increased output, the STT-MRAM generally includes a magnetic memory element with an insulating layer such as of MgO disposed between ferromagnetic layers, utilizing tunneling magneto-resistive effect (TMR).

When using the TMR element, however, it is required to decrease a junction resistance of the TMR element so as to reduce a critical current value of magnetization reversal due to spin injection, thereby avoiding deterioration of the insulating layer. In addition, if a resistance of the insulating layer increases with miniaturization of the element, not only a S/N ratio may decrease because of an increase in shot noise but also a bit transmission rate may decrease. When miniaturizing the element, moreover, since a shape error of the element has a great impact on magnetization characteristics and an output voltage value of the element, it is difficult to improve manufacturing yield. Thus, at present, the STT-MRAM has many problems about increasing the density of the element.

Regarding increasing the density of the element, for example, Japanese Unexamined Patent Application Publication No. 2004-146821 discloses a magnetic memory in which a fixed layer, a spin conductive layer, and a free layer are stacked within a carbon nanotube in the named order. Since the carbon nanotube is a minute tube with a diameter of the order of nm, as is well known, it can be used as a memory element to significantly increase the number of elements arranged within a unit area of the memory, thereby realizing a higher density.

However, since the above magnetic memory utilizes GMR effect similar to the TMR effect, it also has the foregoing problems. Particularly, since it is extremely difficult to accurately control the individual thicknesses of the three layers, i.e., the fixed layer, the spin conductive layer, and the free layer, within the minute carbon nanotube, the manufacturing yield becomes a major issue.

SUMMARY OF THE INVENTION

It is an object of the present invention to provide a magnetic memory element with a simple structure and able to contribute to a higher density, and a magnetic memory device and an information recording/reproducing apparatus using the same.

1. Magnetic Memory Element

In order to achieve the above object, a magnetic memory element according to the present invention comprises a pair of electrodes, a junction layer, at least one carbon nanotube, and at least one nanowire.

The at least one nanowire is made of a ferromagnetic material and extends through a hole of each the at least one carbon nanotube with both ends being electrically connected to the pair of electrodes, respectively.

The junction layer is made of a non-magnetic material and disposed between one of the pair of electrodes and one end of each the at least one nanowire.

The one of the pair of electrodes is made of a ferromagnetic material.

Magnetization of the at least one nanowire is reversed by spin injection performed through the junction layer with the one of the pair of electrodes.

When a DC bias current and a detection current having a frequency coinciding with a magnetic resonance frequency of the nanowire are applied in a superimposed manner, between the electrodes, within a range not reaching a critical current density of the magnetization reversal, the pair of electrodes have a voltage corresponding to a magnetization direction of the nanowire.

The magnetic memory element according to the present invention satisfies structural requirements for spin injection such that the nanowire of a ferromagnetic material is electrically connected to one of the pair of electrodes through the junction layer of a non-magnetic material. Then, the nanowire can be magnetized in a direction corresponding to the direction of a spin-polarized current during spin injection because the magnetization is reversed by spin injection performed through the junction layer with the one of the pair of electrodes.

Thus, the magnetic memory element according to the present invention can store the magnetization direction of the nanowire as information.

The most distinct feature of the magnetic memory element according to the present invention resides in the operation of reproducing information. That is, when reproducing information, a DC bias current and a detection current having a frequency coinciding with a magnetic resonance frequency of the nanowire are applied in a superimposed manner, between the pair of electrodes, within a range not reaching a critical current density of the magnetization reversal of the nanowire.

The detection current is used to detect a certain DC voltage between both ends of the nanowire by inducing magnetic resonance of the nanowire. The magnetic resonance refers to a phenomenon that precession of spin is resonantly induced when applying, to a magnetic material, a high-frequency current having a frequency coinciding with a natural frequency (magnetic resonance frequency) of the magnetic material.

The magnetic memory element according to the present invention reproduces the logical value 1 of information in the case where the DC voltage is obtained from the magnetic resonance, but reproduces the logical value 0 in the case where no voltage is obtained, i.e., the voltage is zero. Here, whether the DC voltage can be obtained or not depends on the magnetization direction of the nanowire determined by the above spin injection. It should be noted that correspondence between the logical value and the voltage may be inverted.

The above DC current varies depending on an angular difference $\theta$ (deg.) between the direction of the detection current and the magnetization direction. That is, with respect to the angular difference $\theta$ (deg.), an amplitude $V_A(\mu V)$ of the DC voltage appearing between both ends of the nanowire because of the magnetic resonance can be expressed by:

$$V_A = V_0 \cdot I_0^2 \cdot \sin 2\theta \cdot \cos \theta$$

(For example, refer to Japanese Unexamined Patent Application Publication No. 2007-235119). Here, $V_0$ is a given constant, and $I_0$ is an amplitude value (mA) of the detection current.

Since the magnetization easy axis (c axis) of the nanowire coincides with its longitudinal direction because of shape anisotropy, the magnetization direction of the nanowire determined by the spin injection is coincident with or opposite to the direction of the detection current flowing through the nanowire (i.e., normal or reverse). In this case, therefore, since the angular difference θ is zero (or 180 degrees), the DC voltage due to magnetic resonance also becomes zero according to the above formula.

Hence, the magnetic memory element according to the present invention is configured such that a certain inclination can be given to the magnetization direction by superimposing the bias current that is a spin-polarized current.

When the magnetization direction m is opposite to the direction of the bias current (i.e., reverse), spin torque acts on the magnetization vector to incline the magnetization direction, causing a certain angular difference θ other than zero. Here, since the current value of the current flowing between the pair of electrodes does not reach a critical current density of the magnetization reversal of the nanowire, the magnetization direction of the nanowire cannot be reversed by the action of the spin torque (θ<<180).

According to the above formula, it is understood that if the current value of the bias current is adjusted to satisfy 0<<θ<<90 or 90<<θ<<180, a certain DC voltage other than zero appears between the pair of electrodes. From the viewpoint of the characteristics of the memory element, however, the higher the DC voltage the better, so that the current value of the bias current is preferably adjusted such that the angular difference θ=45 or 135, where a peak value can be obtained according to the above formula. At this time, the detected DC voltage is treated as the logical value 1 of information.

When the magnetization direction is coincident with the direction of the bias current (i.e., normal), on the other hand, even if the bias current flows through the nanowire, the spin torque does not affect the magnetization vector concerning the magnetization direction of the nanowire. Therefore, the angular difference θ can be maintained at substantially zero without any inclination of the magnetization direction. Thus, the detection current flowing through the nanowire does not induce the magnetic resonance, whereby the voltage appearing between both ends of the nanowire can be maintained at substantially zero. At this time, the detected zero DC voltage is treated as the logical value 0 of information.

As described above, the magnetic memory element according to the present invention can reproduce information (logical value 0 or 1) based on the magnetization direction of the nanowire (normal or reverse) by the characteristic process of supplying the DC bias current and the AC detection current to the nanowire in a superimposed manner and then detecting the voltage between the pair of electrodes.

Moreover, since the magnetic memory element according to the present invention utilizes the minute carbon nanotube as in the prior art described above, they can be arranged densely. Furthermore, since the magnetic memory element according to the present invention has only the nanowire within the carbon nanotube, instead of a plurality of layers, unlike the prior art described above, it has a simple structure.

2. Magnetic Memory Device

A magnetic memory device according to the present invention comprises a bit line, a word line, a plurality of magnetic memory elements, and a plurality of switching elements.

The plurality of magnetic memory elements are each the above magnetic memory element and arranged two-dimensionally with a longitudinal direction of the carbon nanotube and the nanowire being directed normal to the substrate, wherein the pair of electrodes are each electrically connected to the bit line.

The plurality of switching elements are each electrically connected to the bit line at input-output electrodes but electrically connected to the word line at a control electrode for performing on-off control of a current flowing between the pair of electrodes of the magnetic memory element.

In the magnetic memory device according to the present invention, the pair of electrodes of the above magnetic memory element and the input-output electrodes of the switching element are electrically connected to the bit line, while the control electrode of the switching element is electrically connected to the word line. Then, the on-off control of the current flowing between the pair of electrodes of the magnetic memory element is performed by the switching element to record and reproduce information on and from the magnetic memory element, providing a function of a typical memory device.

In the magnetic memory device according to the present invention, moreover, since the magnetic memory elements are two-dimensionally arranged with the longitudinal direction of the carbon nanotube and the nanowire being directed normal to the substrate, they can be densely arranged to contribute to miniaturization and/or increase in capacity.

3. Information Recording/Reproducing Apparatus

An information recording/reproducing apparatus according to the present invention comprises at least one magnetic memory device, an AC power source, a first DC power source, and a second DC power source.

The at least one magnetic memory device is the above magnetic memory device.

The first DC power source supplies a spin-polarized current for performing the spin injection to the at least one magnetic memory device. On the other hand, the second DC power source supplies the bias current to the at least one magnetic memory device.

In addition, the AC power source supplies the detection current to the at least one magnetic memory device.

Since the information recording/reproducing apparatus according to the present invention includes the above-mentioned magnetic memory element and magnetic memory device, it has the same effects as these components.

The other objects, constructions and advantages of the present invention will be further detailed below with reference to the attached drawings. However, the attached drawings show only illustrative examples.

DESCRIPTION OF THE PREFERRED EMBODIMENTS

Figure 1:
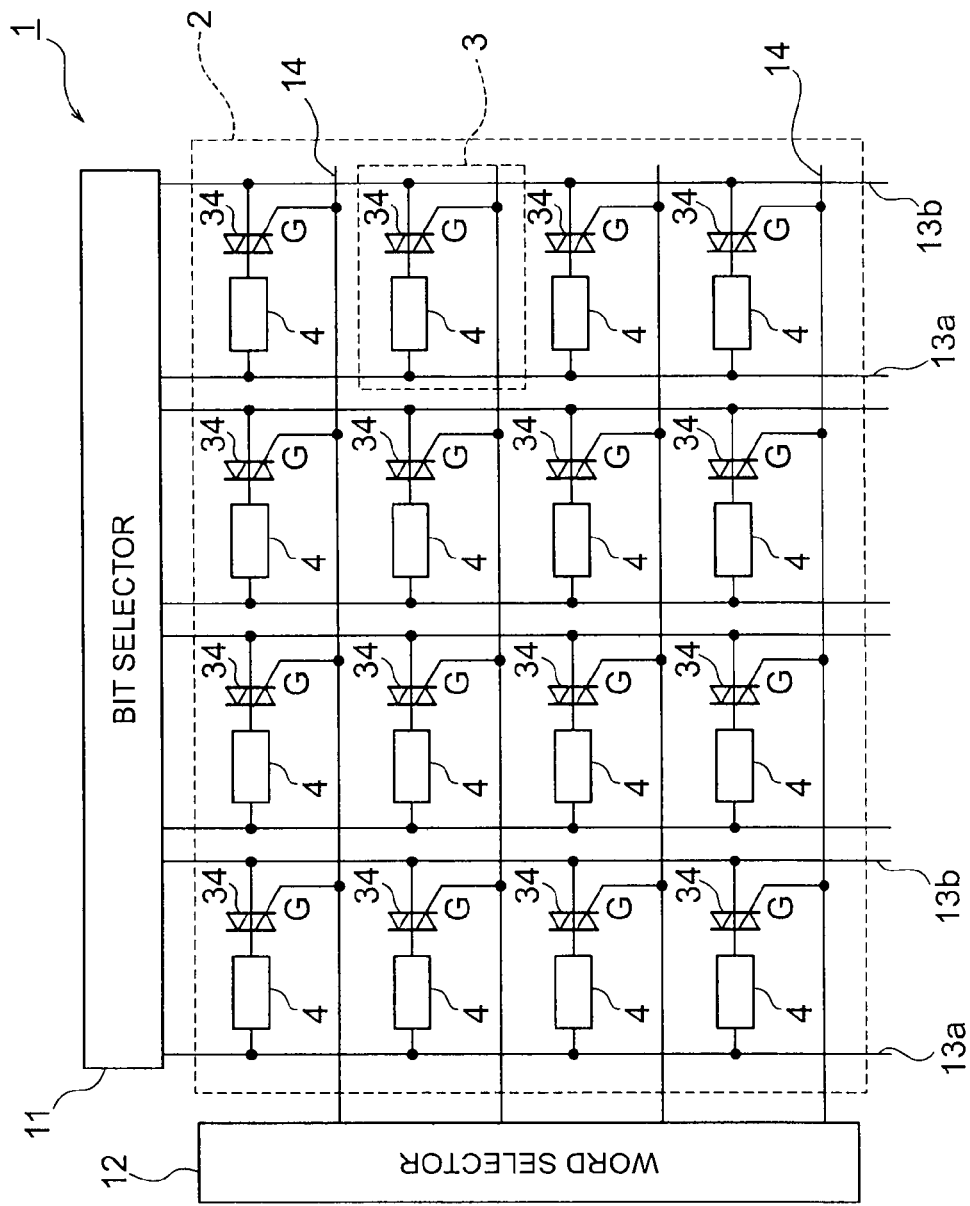
FIG. 1 is a schematic block diagram of a magnetic memory according to the present invention.
Figure 2:
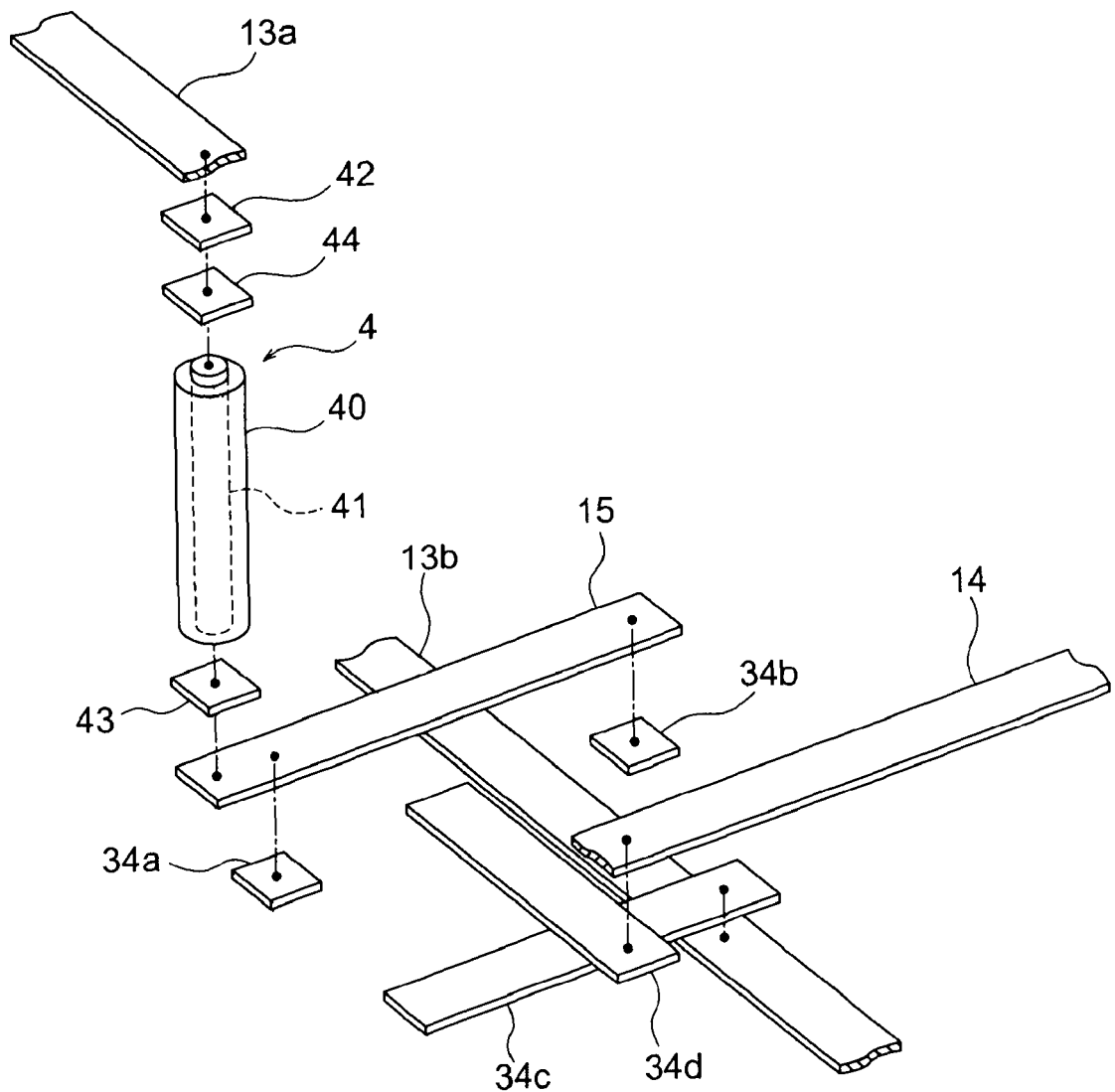
FIG. 2 is a schematic perspective view of a storage area shown in FIG. 1.

FIG. 1 is a circuit diagram of a magnetic memory device 1 according to the present invention, and FIG. 2 is a schematic perspective view of a storage area 3 shown in FIG. 1. The magnetic memory device 1 includes a memory unit 2, a bit selector 11, a word selector 12, a pair of bit lines 13a, 13b, and a word line 14.

The memory unit 2 is composed of a plurality of storage areas 3 that are arranged two-dimensionally. The plurality of storage areas 3 have a function of a memory cell and are arranged two-dimensionally in m rows and n columns (m, n are integers equal to or greater than 2). The pair of bit lines 13a, 13b are provided for each row of the storage area 3, while the word line 14 is provided for each column of the storage area 3.

The word selector 12 has a function of an address decoder and applies a voltage to selected one of the word lines 14 according to an addressing signal input from the outside. The bit selector 11 supplies a current to each pair of the bit lines 13a, 13b according to the addressing signal. That is, the word selector 12 selects one of the two-dimensionally arranged columns and the bit selector 11 selects one of the two-dimensionally arranged rows, whereby one of the plurality of storage areas 3 can be selected as a target to be controlled electrically.

The plurality of storage areas 3 each include a magnetic memory element 4 and a switching element 34.

The switching element 34 is a bidirectional switching element such as a triac with three input-output electrodes 34a, 34b, 34c and a control electrode 34d. The reason for using the bidirectional switching element as described above is that an alternating current is used for reproducing information as will be described later. The two upper input-output electrodes 34a, 34b of the switching element 34 are connected to a common connection line 15, while the lower input-output electrode 34c is electrically connected to the bit line 13b.

On the other hand, the control electrode 34d is electrically connected to the word line 14, wherein bidirectional conduction between the upper input-output electrodes 34a, 34b and the lower input-output electrode 34c is on-off controlled by a voltage applied from the word line 14. The switching element 34 is connected in series to the magnetic memory element 4 through the common connection line 15.

The magnetic memory element 4 according to the present invention includes a pair of electrodes 42, 43, a junction layer 44, a carbon nanotube 40, and a nanowire 41.

The pair of electrodes 42, 43, for example, can be made of at least one material selected from the group consisting of Fe, Co, Ni, FeCo, FePt, FePd, CoPd, CoPt, CoNi and FeNi. For the upper electrode 42, a material having a high spin polarizability is preferably selected.

The junction layer 44 is made of a non-magnetic material such as MgO or $Al_2O_3$ and disposed between the upper electrode 42 of the pair of electrodes and one end of the nanowire 41. The junction layer 44 is necessary for spin injection into the nanowire 41.

As is well known, the carbon nanotube 40 is a minute tube that is made of carbon and has a diameter of the order of nanometer (nm). In the present embodiment, preferably, the carbon nanotube 40 has a diameter of approximately 30 (nm) and a length of 60 to 3000 (nm).

It should be noted that the carbon nanotube 40 may be of a metallic type or a semiconductor type depending on difference in configuration of carbon atoms, but the latter is preferably employed so as to ensure excellent density and directional property of a current flowing through the nanowire 41.

The nanowire 41 is defined as a metallic thin line that has a diameter of the order of nanometer (nm). In the present embodiment, preferably, the diameter of the nanowire 41 is approximately 20 (nm). The nanowire 41 is made of a ferromagnetic material such as iron and extends through a hole of the carbon nanotube 40 with both ends being electrically connected to the pair of electrodes 42, 43, respectively.

Considering mass production, the carbon nanotube 40 containing the nanowire 41 is preferably manufactured using a CVD process, for example. That is, a transition metal catalyst such as iron for growing the carbon nanotube 40 is added to the lower electrode 43 to be formed on the substrate of the magnetic memory device 1, and then a via hole (opening) is centrally formed therein. Subsequently, a carrier gas containing acetylene is supplied along with a ferromagnetic metallic gas to grow crystals of the carbon nanotube 40 and the nanowire 41 only on the surface of the lower electrode 43. Thus, the nanowire 41 and the carbon nanotube 40 can be formed with their longitudinal direction being directed normal to the substrate.

With such a process of allowing the self-growth of the carbon nanotube 40, a high-integration, large-capacity magnetic memory device 1 can be manufactured using inexpensive production facilities. Moreover, since the nanowire 41 can be composed of a single crystal, it is possible to realize an excellent polarizability that cannot be obtained by a thin film formation process such as sputtering.

In the following production process, moreover, an insulating film is formed by sputtering or the like to cover the carbon nanotube 40, and then the surface is polished using a CMP process or the like until the carbon nanotube 40 has a predetermined length. Then, the magnetic memory element 4 can be obtained by forming the junction layer 44 and the upper electrode 42 on the exposed end face of the nanowire 41.

In the present embodiment, each storage area 3 includes a single nanowire 41 and a single carbon nanotube 40 containing it, but without being limited thereto, a single storage area 3 may include a plurality of pairs of the carbon nanotube 40 and the nanowire 41. In this case, although the degree of integration decreases because of an area increase in the deposition plane of the device, there is an advantage that electrical resistance can be reduced between the pair of electrodes 42, 43.

The nanowire 41 and the junction layer 44 have conductivity and allow a current to flow between the pair of electrodes 42, 43 from the bit lines 13a, 13b. The switching element 34 can perform on-off control of the current flowing between the pair of electrodes 42, 43 with a voltage applied to the control terminal 34d from the word line 14. Thus, information can be recorded on or reproduced from the magnetic memory element 4 of a selected storage area 3.

Figure 3:
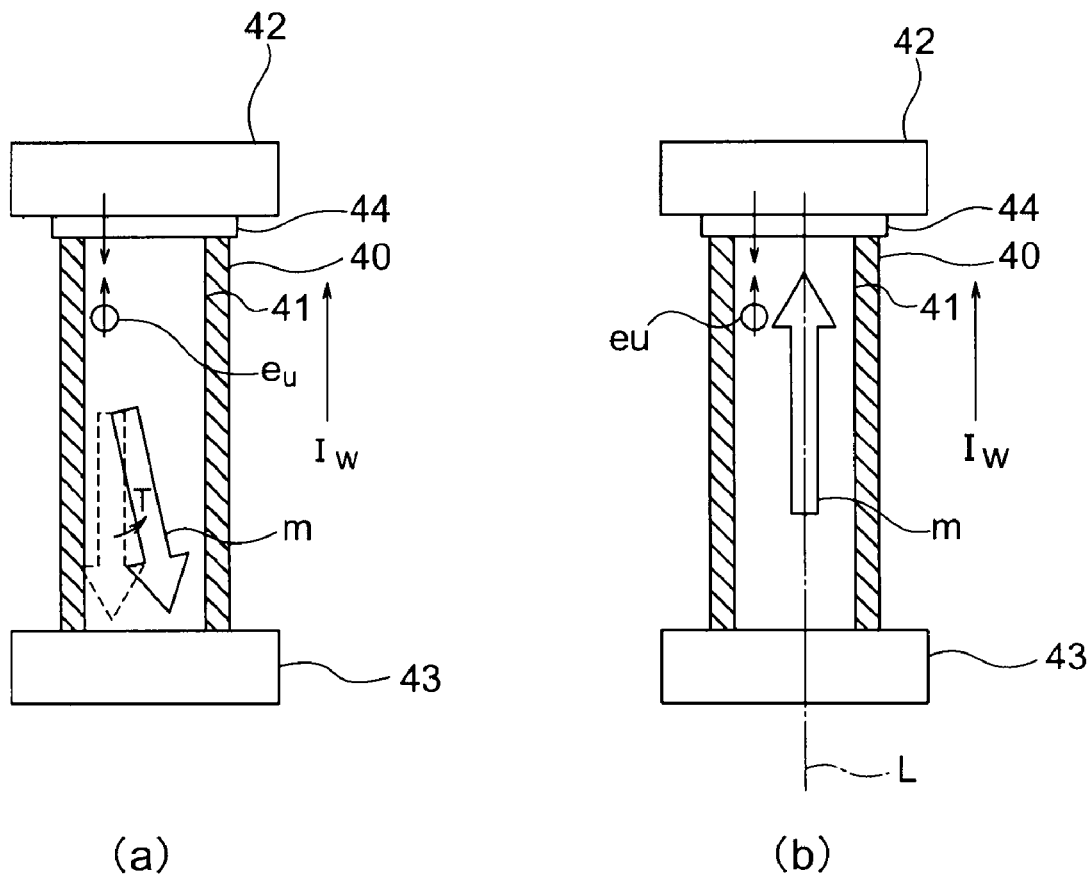
FIG. 3 is a schematic sectional view showing a recording operation of a magnetic memory element according to the present invention.
Figure 4:
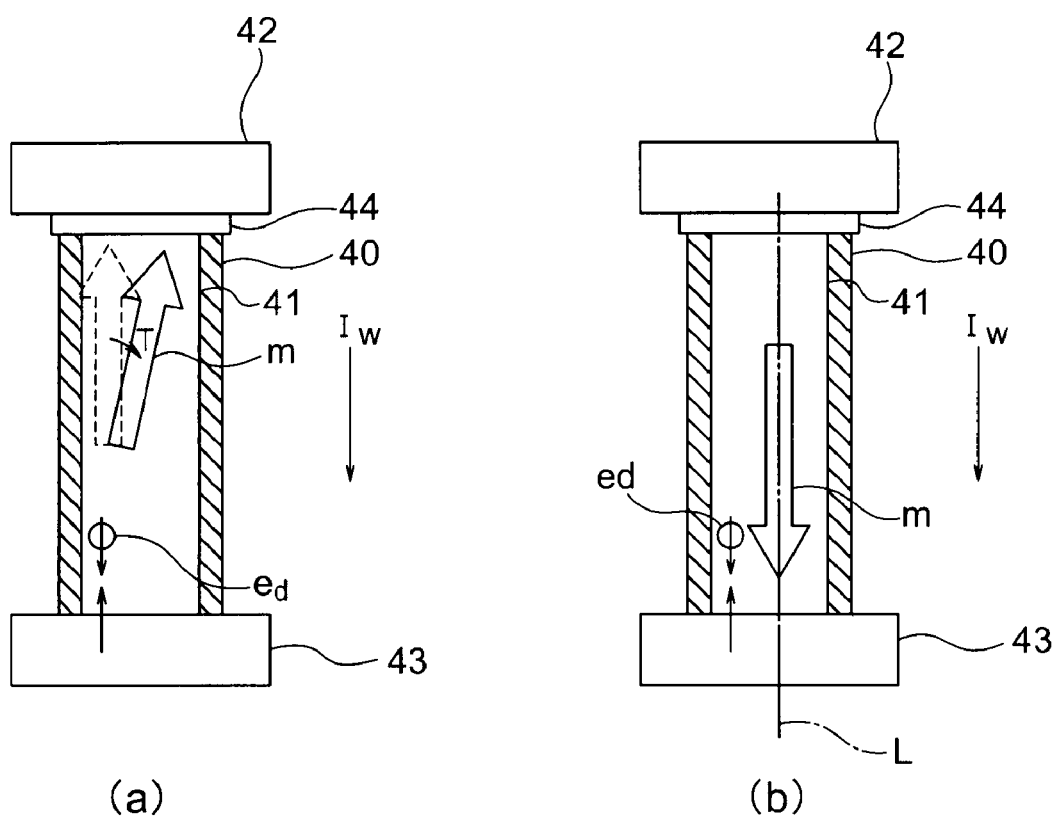
FIG. 4 is a schematic sectional view showing a recording operation of a magnetic memory element according to the present invention.

At first, the operation of recording information on the magnetic memory element 4 will be described with reference to FIGS. 3 and 4. The magnetic memory element 4 of FIGS. 3 and 4 is illustrated in a schematic sectional view.

The magnetic memory element 4 satisfies structural requirements for spin injection such that the nanowire 41 of a ferromagnetic material is electrically connected to one 42 of the pair of electrodes through the junction layer 44 of a non-magnetic material. Then, the nanowire 41 can be magnetized in a direction corresponding to the direction of a spin-polarized current during spin injection because the magnetization is reversed by spin injection performed through the junction layer 44 with the one 42 of the pair of electrodes.

Thus, the magnetic memory element 4 can store a magnetization direction m of the nanowire 41 as information. The nanowire 41 has a magnetization easy axis (c axis) along its longitudinal direction because of the shape anisotropy, so that when no spin torque T is applied thereto, the magnetization direction m coincides with the direction from the upper electrode 42 to the lower electrode 43 or the opposite direction, which corresponds to a logical value 1 or 0 of information.

In the information recording operation, at first, a write current Iw being a spin-polarized current flows between the pair of electrodes 42, 43 through the bit lines 13a, 13b. FIG. 3 shows a case where the write current Iw flows from the lower electrode 43 to the upper electrode 42. In this case, electrons $e_u$ having an up-spin state are accumulated within the nanowire 41.

As shown in FIG. 3(a), the magnetization vector of the nanowire 41 is affected by the spin torque T of the up-spin electrons $e_u$ to incline the magnetization direction m upward in the figure. Then, when the density of the up-spin electrons $e_u$ exceeds a threshold value, the magnetization direction m is directed upward in the figure, as shown in FIG. 3(b), completing the magnetization reversal. Thus, information of the logical value 0 is written on the magnetic recording element 4.

On the other hand, FIG. 4 shows a case where the write current Iw flows from the upper electrode 42 to the lower electrode 43. In this case, electrons $e_d$ having a down-spin state are accumulated within the nanowire 41.

As shown in FIG. 4(a), the magnetization vector of the nanowire 41 is affected by the spin torque T of the down-spin electrons $e_d$ to incline the magnetization direction m downward in the figure. Then, when the density of the down-spin electrons $e_d$ exceeds a threshold value, the magnetization direction m is directed downward in the figure, as shown in FIG. 4(b), completing the magnetization reversal. Thus, information of the logical value 1 is written on the magnetic recording element 4.

Both FIG. 3 and FIG. 4 illustrate the case where the magnetization vector m is initially directed in an opposite direction to an intended reversed direction, but it is regardless to say that the magnetization reversal does not occur in a case where the magnetization vector m is directed in an intended reversed direction from the first. In other words, the magnetization reversal does not occur in a case where a logical value of information of the magnetic memory element 4 is identical to that of information to be written.

As described above, the magnetic memory element 4 according to the present invention adopts a magnetization reversal method using a spin transfer torque for recording information.

However, as is well known, another method using a current magnetic field is also applicable as a magnetization reversal method. When adopting the current magnetic field method, for example, it is possible that an additional carbon nanotube and an additional nanowire to be contained therein are arranged and a current is passed through this nanowire to generate a current magnetic field, thereby performing the magnetization reversal of the above nanowire 41.

Figure 5:
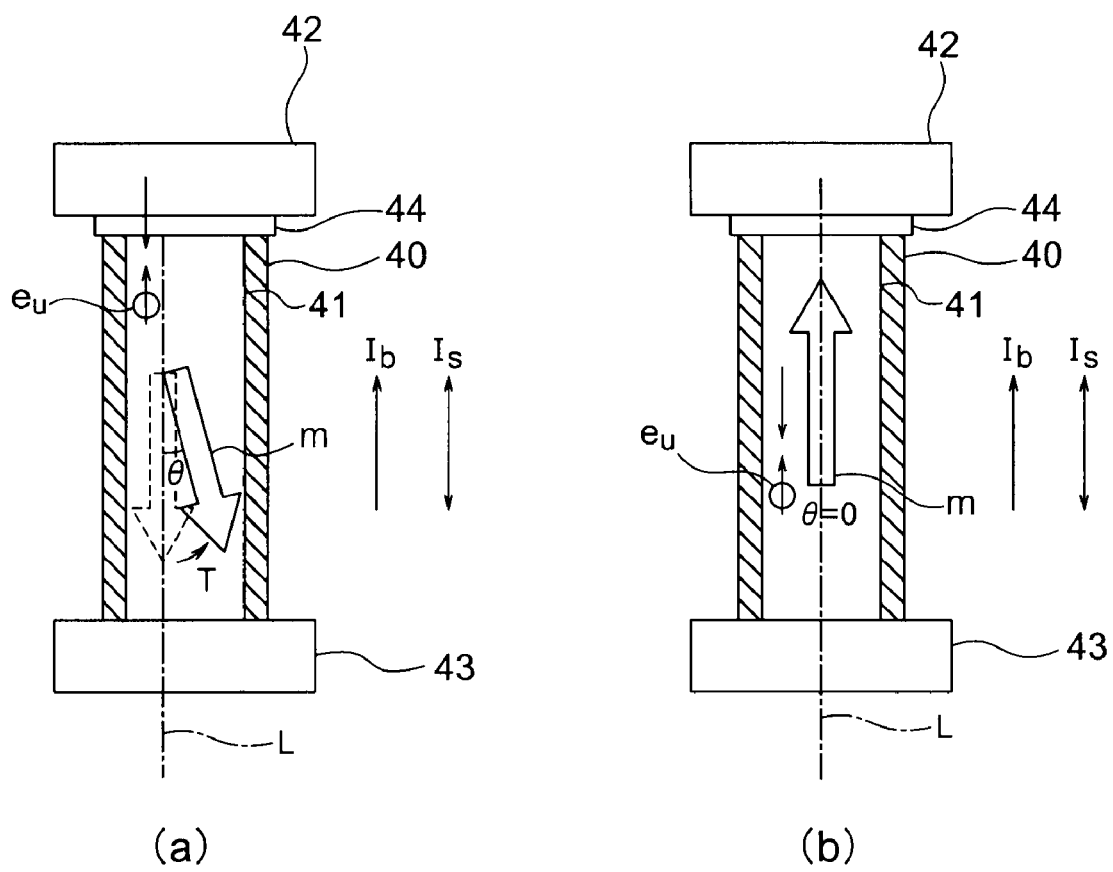
FIG. 5 is a schematic sectional view showing a reproducing operation of a magnetic memory element according to the present invention.

The most distinct feature of the magnetic memory element 4 according to the present invention resides in the operation of reproducing information. That is, when reproducing information, as shown in FIG. 5, a DC bias current $I_b$ and a detection current L having a frequency coinciding with a magnetic resonance frequency of the nanowire 41 are applied in a superimposed manner, between the pair of electrodes 42, 43, within a range not reaching a critical current density of the magnetization reversal of the nanowire 41.

The detection current $I_s$ is a RF (radio frequency) current and used to detect a certain DC voltage between both ends of the nanowire 41 by inducing magnetic resonance of the nanowire 41. The magnetic resonance refers to a phenomenon that precession of spin is resonantly induced when applying, to a magnetic material, a high-frequency current having a frequency coinciding with a natural frequency (magnetic resonance frequency) of the magnetic material.

The magnetic memory element 4 according to the present invention reproduces the logical value 1 of information in the case where the DC voltage is obtained from the magnetic resonance, but reproduces the logical value 0 in the case where no voltage is obtained, i.e., the voltage is zero. Here, whether the DC voltage can be obtained or not depends on the magnetization direction m of the nanowire 41 determined by the write current Iw. It should be noted that correspondence between the logical value and the voltage may be inverted.

Figure 6:
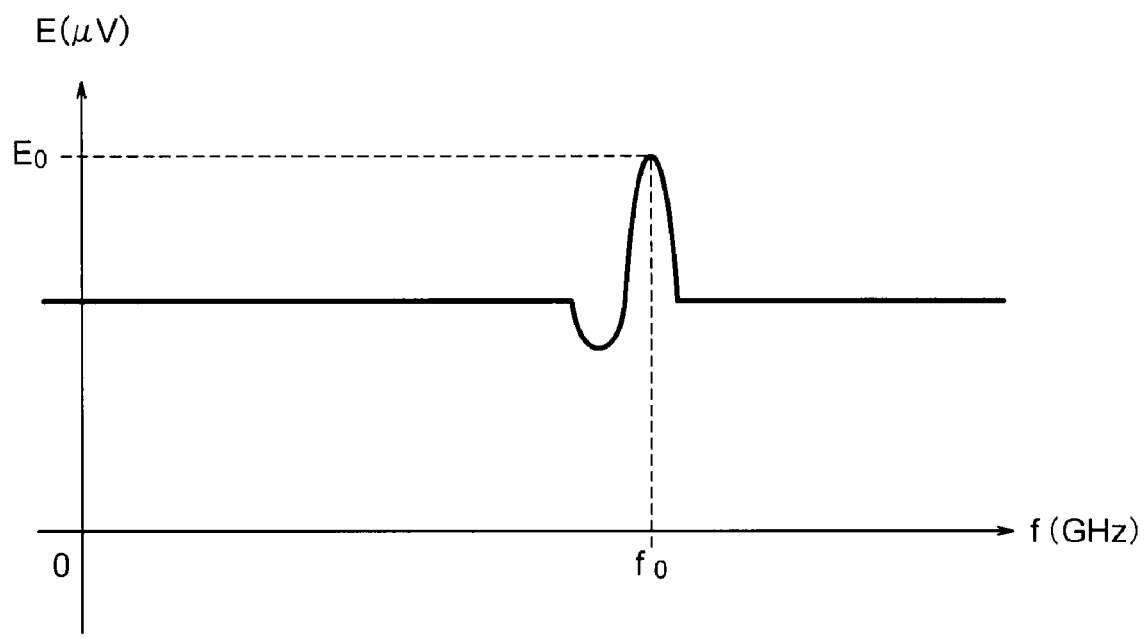
FIG. 6 is a graph showing characteristics of a voltage appearing between both ends of a nanowire, with respect to a frequency of a detection current.

As shown in FIG. 6, when a frequency f (GHz) of the high-frequency detection current $I_s$ flowing through the nanowire 41 coincides with a magnetic resonance frequency $f_0$, a certain DC current $E_0$ appears between the pair of electrodes 42, 43. However, the DC current $E_0$ varies depending on an angular difference θ (deg.) between the direction of the detection current $I_s$ and the magnetization direction m.

Figure 7:
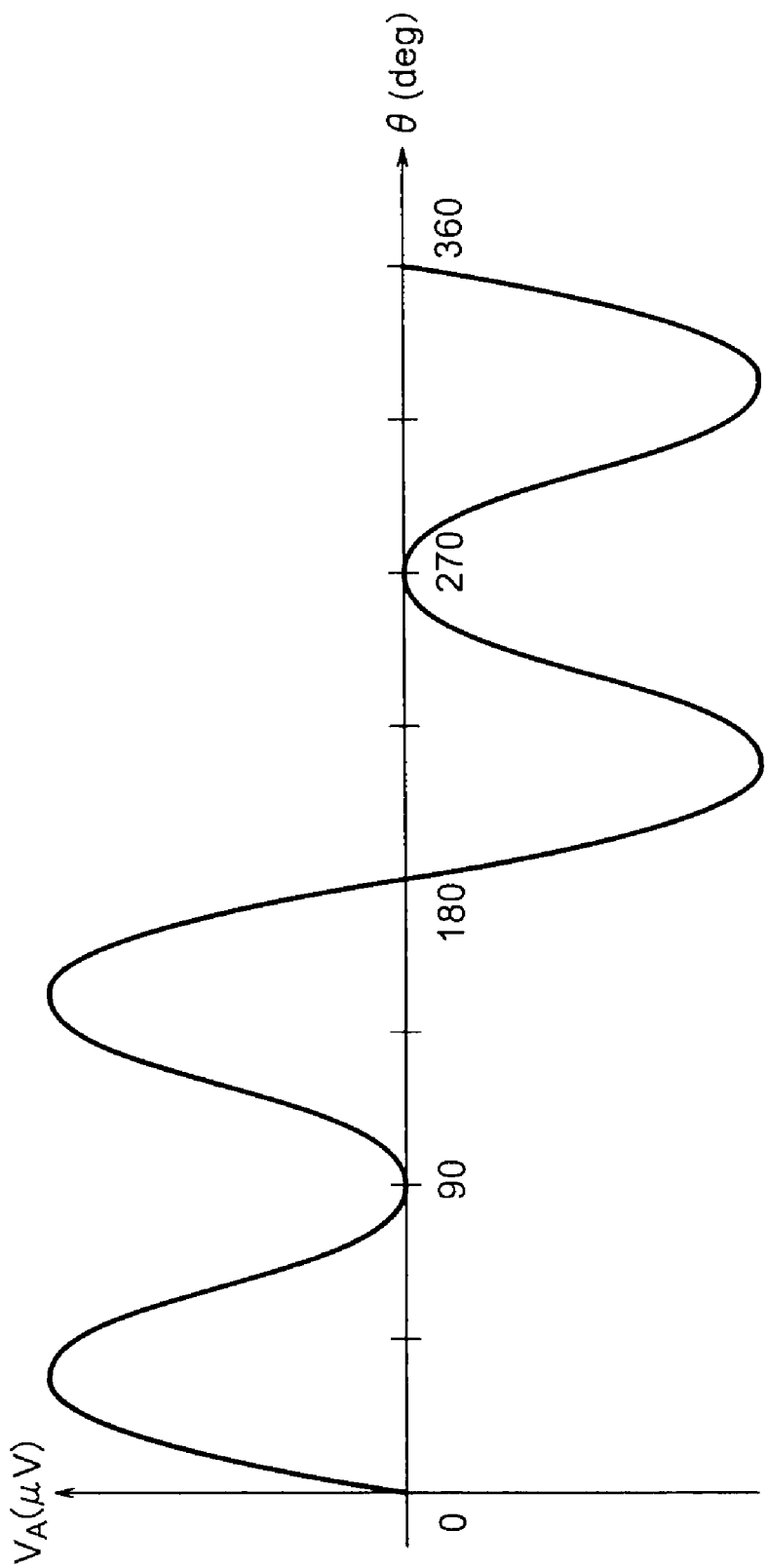
FIG. 7 is a graph showing amplitude characteristics of a DC voltage appearing between both ends of a nanowire because of magnetic resonance, with respect to an angular difference between a current direction and a magnetization direction.

As shown in FIG. 7, with respect to the angular difference θ (deg.), an amplitude $V_A$(μV) of the DC voltage $E_0$ appearing between both ends of the nanowire 41 because of the magnetic resonance can be expressed by:

$$V_A = V_0 \cdot I_0^2 \cdot \sin 2\theta \cdot \cos \theta$$

(For example, refer to Japanese Unexamined Patent Application Publication No. 2007-235119). Here, $V_0$ is a given constant, and $I_0$ is an amplitude value (mA) of the detection current $I_s$.

Since the magnetization easy axis (c axis) of the nanowire 41 coincides with its longitudinal direction L, the magnetization direction m of the nanowire 41 determined by the write current Iw is coincident with or opposite to the direction of the detection current $I_s$ flowing through the nanowire 41 (i.e., normal or reverse), as shown in FIGS. 3(b) and 4(b). In this case, therefore, since the angular difference θ is zero (or 180 degrees), the DC voltage due to magnetic resonance also becomes zero according to FIG. 6 and the above formula.

Hence, the magnetic memory element 4 according to the present invention is configured such that a certain inclination can be given to the magnetization direction m by superimposing the bias current $I_b$ that is a spin-polarized current.

When the magnetization direction m is opposite to the direction of the bias current $I_b$ (i.e., reverse), as shown in FIG. 5(a), the spin torque T of the up-spin electrons $e_u$ acts on the magnetization vector to incline the magnetization direction m, causing a certain angular difference θ other than zero. Here, since the current values of the currents $I_s$, $I_b$ flowing between the pair of electrodes do not reach a critical current density of the magnetization reversal of the nanowire 41, the magnetization direction m of the nanowire 41 cannot be reversed by the action of the spin torque T, as shown in FIG. 3(b) (θ<<180). That is, the current values of the detection current $I_s$ and the bias $I_b$ are set considerably lower than that of the write current Iw.

According to the above formula, it is understood that if the current value of the bias current $I_b$ (i.e., the density of the up-spin electrons $e_u$ shown in FIG. 5(a)) is adjusted to satisfy $0 < < \theta < < 90$ or $90 < < \theta < < 180$, a certain DC voltage other than zero appears between the pair of electrodes 42, 43. From the viewpoint of the characteristics of the memory element, however, the higher the DC voltage the better, so that the current value of the bias current $I_b$ is preferably adjusted such that the angular difference $\theta=45$ or 135, where a peak value can be obtained according to the above formula. At this time, the detected DC voltage is treated as the logical value 1 of information in the magnetic memory 1.

When the magnetization direction m is coincident with the direction of the bias current $I_b$ (i.e., normal), as shown in FIG. 5(b), on the other hand, even if the bias current $I_b$ flows through the nanowire 41, the magnetization direction m has been already directed upward in the figure, so that the spin torque of the up-spin electrons $e_u$ does not affect the magnetization vector m concerning the magnetization direction of the nanowire. Therefore, the angular difference $\theta$ can be maintained at substantially zero without any inclination of the magnetization direction m, unlike the case of FIG. 5(a). Thus, the detection current $I_s$ flowing through the nanowire 41 does not induce the magnetic resonance, whereby the voltage appearing between both ends of the nanowire 41 can be maintained at substantially zero. At this time, the detected zero DC voltage is treated as the logical value 0 of information in the magnetic memory 1.

In the present embodiment, the direction of the bias current $I_b$ is the direction from the lower electrode 43 to the upper electrode 42, but it may be the opposite direction, i.e., the direction from the upper electrode 42 to the lower electrode 43. In this case, when the magnetization direction m is directed upward in the figure, as shown in FIG. 3(b), the bias current $I_b$ causes inclination of the magnetization vector to generate a certain DC voltage (the logical value 1), while when the magnetization direction m is directed downward in the figure, as shown in FIG. 4(b), the bias current $I_b$ does not cause inclination of the magnetization vector, so that the resulting voltage is substantially zero (the logical value 0).

As described above, the magnetic memory element 4 according to the present invention can reproduce information (logical value 0 or 1) based on the magnetization direction m of the nanowire 41 (normal or reverse) by the characteristic process of supplying the DC bias current $I_b$ and the AC detection current $I_s$ to the nanowire 41 in a superimposed manner and then detecting the voltage between the pair of electrodes 42, 43. However, as the method for inclining the magnetization direction of the nanowire 41, there may be adopted the above-mentioned method using a current magnetic field, instead of the method using the spin-torque.

Moreover, since the magnetic memory element 4 according to the present invention utilizes the minute carbon nanotube 40 as in the prior art described above, they can be arranged densely. Furthermore, since the magnetic memory element 4 according to the present invention has only the nanowire 41 within the carbon nanotube 40, instead of a plurality of layers, unlike the prior art described above, it has a simple structure. With the magnetic memory element 4 having such a simple structure, the magnetic memory device 1 according to the present invention can reduce parameters about magnetic properties that have to be controlled during manufacturing, making expensive deposition apparatuses unnecessary.

Figure 8:
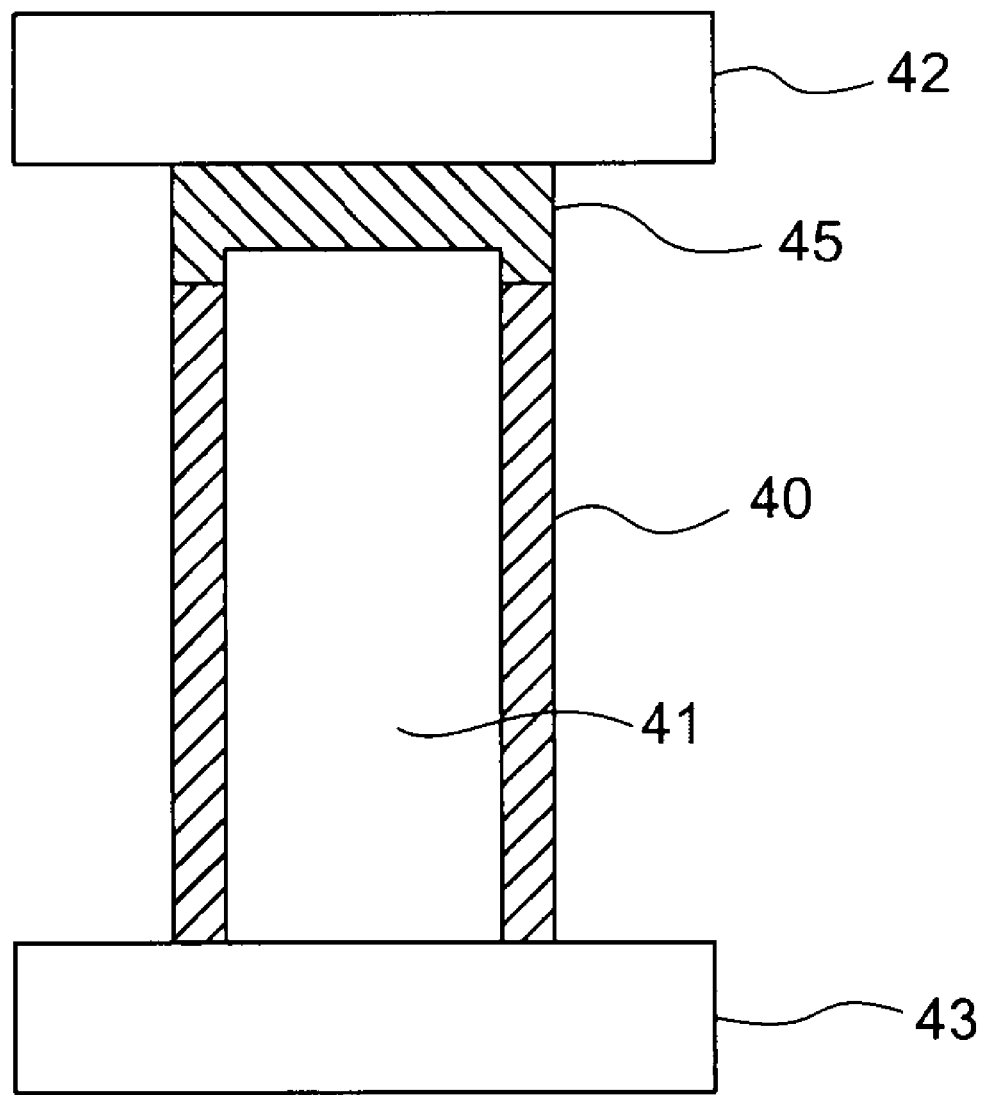
FIG. 8 is a schematic sectional view of a magnetic memory element according to another embodiment.

It should be noted that in the present embodiment, the spin injection structure of the magnetic memory element 4 is provided with the junction layer 44, but alternatively, a portion 45 of the carbon nanotube 40 may be used as a junction layer, for example, as shown in FIG. 8. The junction layer 45 is formed at one end of the carbon nanotube 40 as a lid-like portion continuous with one end close to the upper electrode 42 so as to close the hole. With this structure, the process of forming the junction layer 44 from a different material can be omitted to reduce manufacturing cost.

Figure 9:
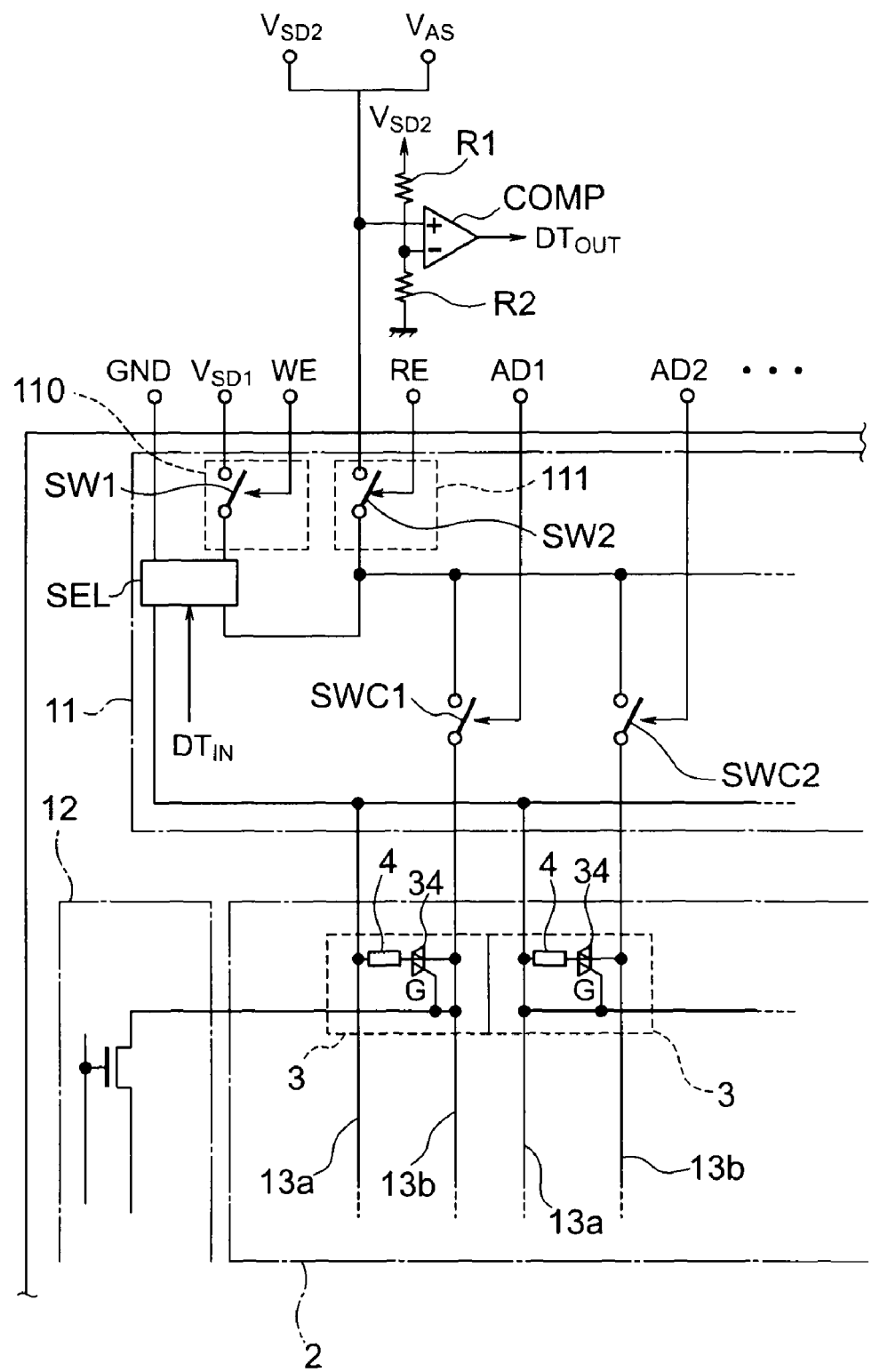
FIG. 9 is a schematic circuit diagram of a bit selector.

Next will be described the bit selector 11 for performing current control. FIG. 9 is a schematic circuit diagram of the bit selector 11.

The bit selector 11 includes a write current generator 110 for supplying the write current Iw to the magnetic memory element 4, a read current generator 111 for supplying the bias current $I_b$ and the detection current $I_s$ to the magnetic memory element 4, and a switching circuit SEL for switching the direction of the write current Iw to be passed through the nanowire 41, wherein electrodes connected to respective power sources $V_{SD1}$, $V_{SD2}$, $V_{SA}$ for generating those currents are selected by control input.

When writing information, at first, a switch SW1 is turned on by a write control signal WE, whereby the electrode of the first DC power source $V_{SD1}$ and a ground electrode GND are electrically connected to the bit lines 13a, 13b. Then, row address switches SWC1, SWC2, and so on are sequentially turned on in response to input of addressing data AD1, AD2, and so on to supply the write current Iw to the magnetic memory element 4.

The logical value 0 or 1 is assigned to each addressing data AD1, AD2, and so on of information to be written, and a data signal $DT_{IN}$ indicating the logical value is entered into the switching circuit SEL. The switching circuit SEL is provided to switch the positional relationship between the electrode of the first DC power source $V_{SD1}$ and the ground electrode GND with respect to the bit lines 13a, 13b. This is because the magnetization direction m is determined by the direction of the write current Iw applied to the magnetic memory element 4, wherein the logical value 0 or 1 of information to be written varies accordingly, as described above. It should be noted that in order to perform writing at a high speed, the switching circuit SEL is preferably provided for each row of the storage areas 3.

When reproducing information, on the other hand, a switch SW2 is turned on by a read control signal RE, whereby electrodes of the second DC power source $V_{SD2}$ and the AC power source $V_{SA}$ and the ground electrode GND are electrically connected to the bit lines 13a, 13b. Then, the row address switches SWC1, SWC2, and so on are sequentially turned on in response to input of the addressing data AD1, AD2, and so on to supply the bias current $I_b$ and the detection current $I_s$ to the magnetic memory element 4.

A comparator COMP is an element for detecting a voltage of the magnetic memory element 4 with a plus terminal (+) electrically connected to the bit line 13b through the switch SW2. On the other hand, a minus terminal (−) is electrically connected to a contact of two resistors R1, R2 placed in series. The resistors R1, R2 are electrically connected to between the electrode of the power source $V_{SD2}$ and the ground electrode GND to divide a supply voltage, whereby the DC voltage appearing between the electrodes 42, 43 of the magnetic memory element 4 as described above is supplied to the minus terminal (−).

Thus, the comparator COMP can detect the voltage appearing between the electrodes 42, 43 of the magnetic memory element 4 and output a data signal $DT_{OUT}$ indicating the logical value 0, 1 as information. It should be noted that in order to perform reproducing of information at a high speed, the comparator COMP is preferably provided for each row of the storage areas 3.

Figure 10:
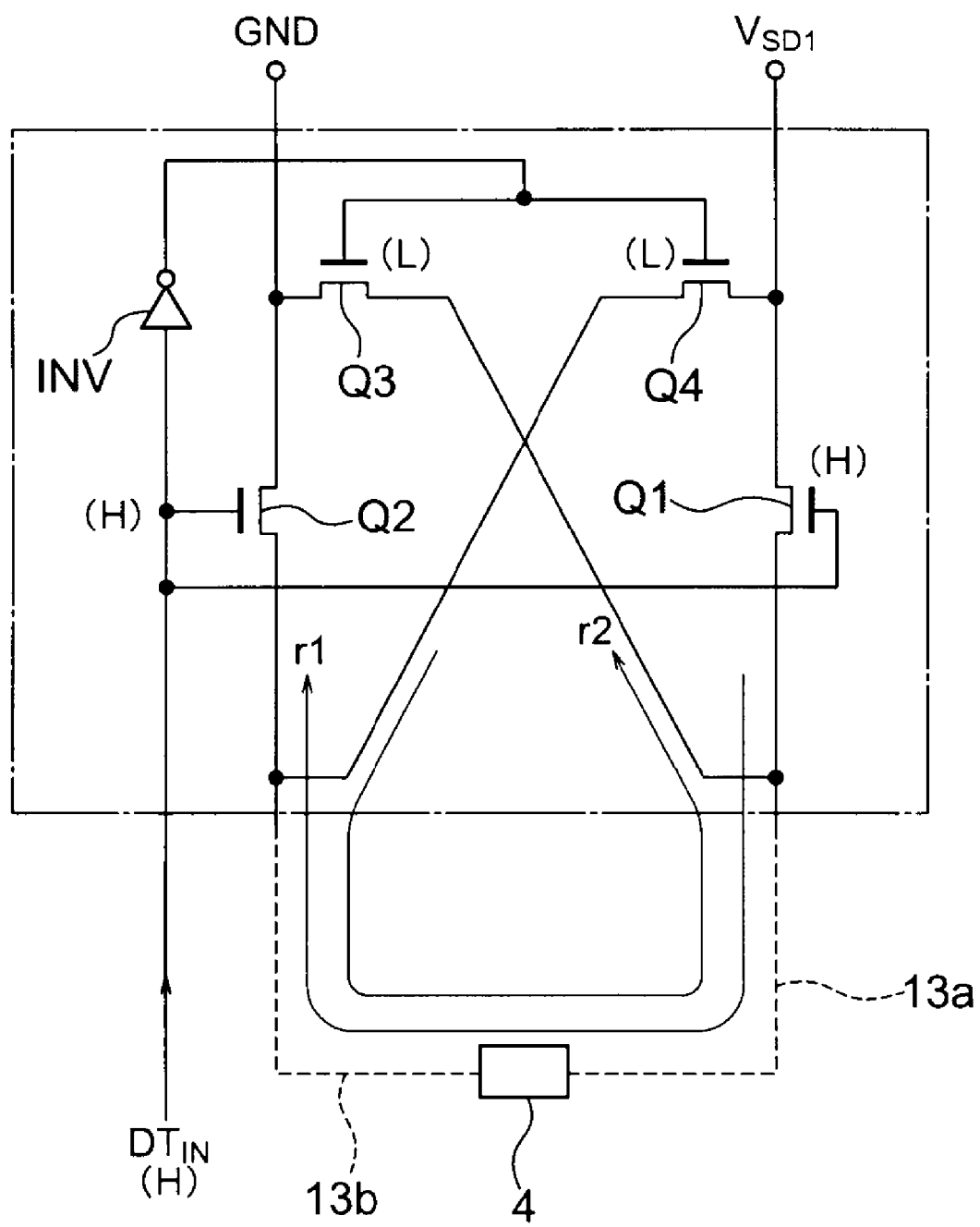
FIG. 10 is a schematic circuit diagram of a switching circuit.

Here, the direction of the write current Iw can be switched by the switching circuit SEL, as described above. FIG. 10 shows a schematic circuit diagram of the switching circuit SEL.

A transistor Q1 is connected to between the electrode of the first DC power source $V_{SD1}$ and the bit line 13a, while a transistor Q2 is connected to between the ground electrode GND and the bit line 13b. Between these transistors Q1, Q2, there is disposed the magnetic memory element 4 through the bit lines 13a, 13b. When the input data $DT_{IN}$ is high level (H), the transistors Q1, Q2 are turned on to let the current Iw flow through a clockwise current path r1. At this time, the transistors Q3, Q4 are turned off because their gates are connected to an inverter INV.

The transistor Q3 is disposed between an output electrode of the transistor Q2 and an output electrode of the transistor Q1, while the transistor Q4 is disposed between an input electrode of the transistor Q1 and an input electrode of the transistor Q2.

When the input data $DT_{IN}$ is low level (L), the transistors Q3, Q4 are turned on by the inverter INV to let the current Iw flow through a counter-clockwise current path r2. At this time, the transistors Q1, Q2 are turned off because the input into these control electrodes is low level (L).

As described above, the switching circuit SEL switches the direction of the write current Iw according to the logical value 0, 1 of information.

In the magnetic memory device 1 according to the present invention, the pair of electrodes 42, 43 of the above magnetic memory element 4 and the input-output electrodes 34a, 34b, 34c of the switching element 34 are electrically connected to the bit lines 13a, 13b, while the control electrode 34d of the switching element 34 is electrically connected to the word line 14. Then, the on-off control of the current flowing between the pair of electrodes 42, 43 of the magnetic memory element 4 is performed by the switching element 34 to record and reproduce information on and from the magnetic memory element 4, providing a function of a typical memory device.

In the magnetic memory device 1 according to the present invention, moreover, since the magnetic memory elements 4 are two-dimensionally arranged with the longitudinal direction of the carbon nanotube 40 and the nanowire 41 being directed normal to the substrate, they can be densely arranged to contribute to miniaturization and/or increase in capacity.

Next, an information recording/reproducing apparatus according to the present invention will be described with reference to a schematic configuration shown in FIG. 11.

The information recording/reproducing apparatus is not limited to a storage for backing up a large amount of information or a device for mainly recording and reproducing digital information such as video, nonmoving picture or music, but examples also include a portable communication terminal such as a cellular phone, a computer such as a personal computer or a server, and a small memory device to be used in combination therewith. In the present embodiment, among them, a storage will be described by way of example.

The information recording/reproducing apparatus includes an input-output port 50, a controller 51, at least one magnetic memory device 1, an AD power source $V_{SA}$, a first DC power source $V_{SD1}$, and a second DC power source $V_{SD2}$.

For example, the input-output port 50 is a communication processing IC for receiving data $D_{IN}$ from a network and transmitting data $D_{OUT}$ to the network. The input-output port 50 transmits the reception data $D_{IN}$ to the controller 51 and receives the transmission data $D_{OUT}$ from the controller 51.

For example, the controller 51 is a processing unit such as a CPU for writing the reception data $D_{IN}$ on the magnetic memory device 1 and reading the transmission data $D_{OUT}$ from the magnetic memory device 1 via a bus 52. That is, the controller 51 transmits the above-mentioned write control signal WE, read control signal RE, addressing data AD1, AD2 and so on, and input data signal $DT_{IN}$ to the magnetic memory device 1 and receives the output signal data signal $DT_{OUT}$ from the magnetic memory device 1.

Here, the first DC power source $V_{SD1}$ supplies the spin-polarized current Iw for performing the above-mentioned spin injection to the magnetic memory device 1. On the other hand, the second DC power source $V_{sD2}$ supplies the above-mentioned bias current $I_b$ to the magnetic memory device 1. Moreover, the AC power source $V_{SA}$ supplies the above-mentioned detection current $I_s$ to the magnetic memory device 1.

With this configuration, the information recording/reproducing apparatus can receive a large amount of data $D_{IN}$ from a network intended for back up and record it on the magnetic memory device 1 at a high speed and, if needed, can also reproduce a large amount of data $D_{OUT}$ from the magnetic memory device 1 at a high speed and transmit it to the network.

Since the information recording/reproducing apparatus according to the present invention includes the above-mentioned magnetic memory element 4 and magnetic memory device 1, it has the same effects as these components.

Figure 11:
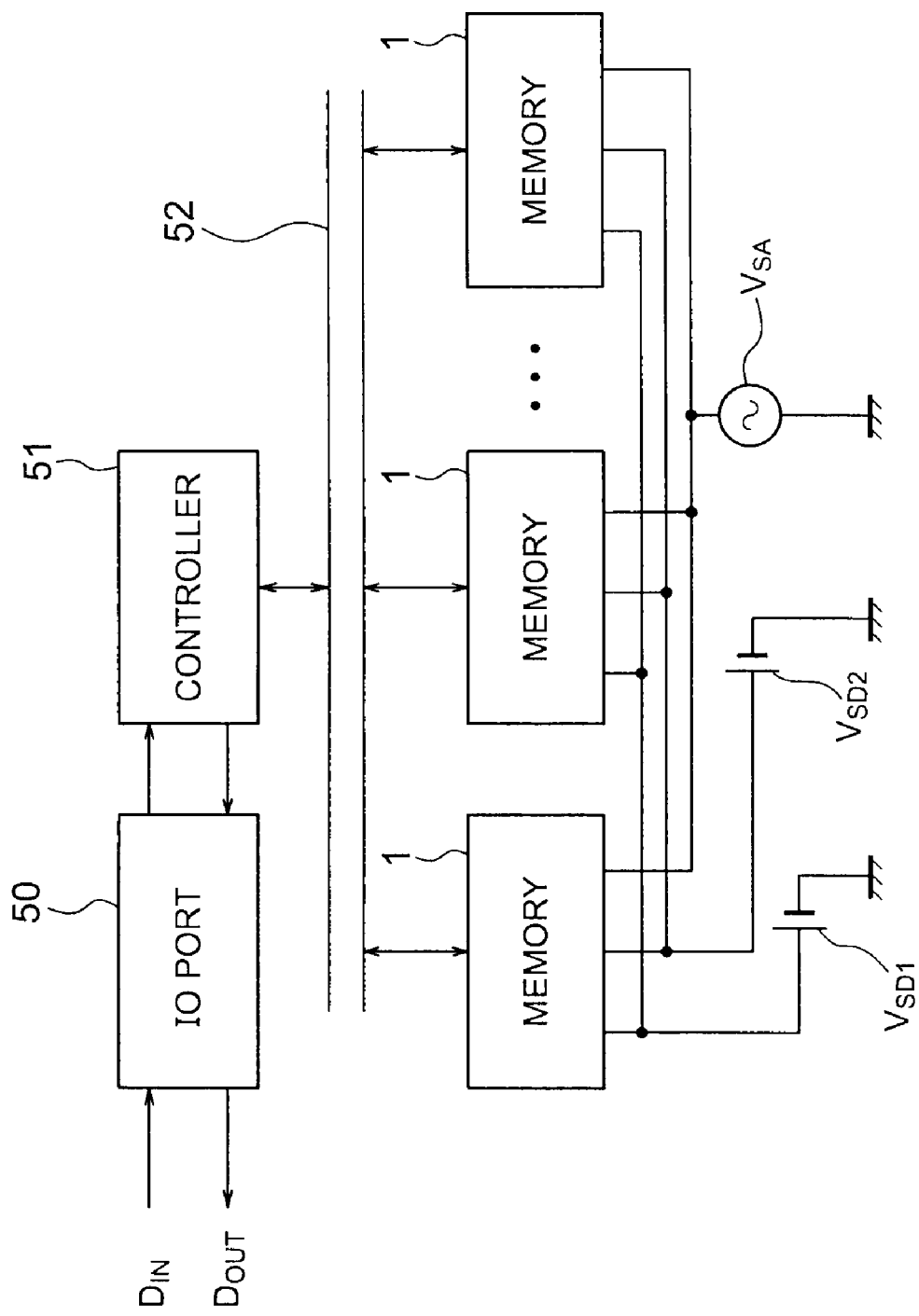
FIG. 11 is a schematic block diagram of an information recording/reproducing apparatus according to the present invention.

In the present embodiment, the storage is taken as an example, but in the case of a device which does not require a computing function, such as a small memory device, the input-output port 50 and the controller 51 may be omitted from the configuration shown in FIG. 11. In this case, a buffer is required as a substitute, and this buffer is connected to the bus 52 to have a function of interfacing with another device such as a computer.

The present invention has been described in detail above with reference to preferred embodiments. However, obviously those skilled in the art could easily devise various modifications of the invention based on the technical concepts underlying the invention and teachings disclosed herein.

What is claimed is:

1. A magnetic memory element comprising a pair of electrodes, a junction layer, at least one carbon nanotube, and at least one nanowire, wherein said at least one nanowire is made of a ferromagnetic material and extends through a hole of each said at least one carbon nanotube with both ends being electrically connected to said pair of electrodes, respectively, said junction layer is made of a non-magnetic material and disposed between one of said pair of electrodes and one end of each said at least one nanowire, said one of said pair of electrodes is made of a ferromagnetic material, magnetization of said at least one nanowire is reversed by spin injection performed through said junction layer with said one of said pair of electrodes, and when a DC bias current and a detection current having a frequency coinciding with a magnetic resonance frequency of said nanowire are applied in a superimposed manner, between said electrodes, within a range not reaching a critical current density of the magnetization reversal, said pair of electrodes have a voltage corresponding to a magnetization direction of said nanowire.

2. The magnetic memory element of claim 1, wherein said junction layer is disposed at one end of said at least one carbon nanotube as a lid-like portion continuous with said one end so as to close said hole.

3. The magnetic memory element of claim 1, wherein said carbon nanotube is of a semiconductor type.

4. The magnetic memory element of claim 1, wherein the other of said pair of electrodes contains a transition metal catalyst for growing said carbon nanotube.

5. A magnetic memory device comprising a substrate, a bit line, a word line, a plurality of magnetic memory elements, and a plurality of switching elements, wherein
said plurality of magnetic memory elements are each the magnetic memory element of claim 1 and arranged two-dimensionally with a longitudinal direction of said carbon nanotube and said nanowire being directed normal to said substrate, wherein said pair of electrodes are each electrically connected to said bit line,
said plurality of switching elements are each electrically connected to said bit line at input-output electrodes but electrically connected to said word line at a control electrode for performing on-off control of a current flowing between said pair of electrodes of said magnetic memory element.

6. The magnetic memory device of claim 5, wherein said plurality of switching elements are each a triac.

7. An information recording/reproducing apparatus comprising at least one magnetic memory device, an AC power source, a first DC power source, and a second DC power source, wherein
said at least one magnetic memory device is the magnetic memory device of claim 5,
said first DC power source supplies a spin-polarized current for performing said spin injection to said at least one magnetic memory device,
said second DC power source supplies said bias current to said at least one magnetic memory device, and
said AC power source supplies said detection current to said at least one magnetic memory device.

* * * * *